United States Patent
Wilson et al.

(10) Patent No.: US 10,630,824 B2
(45) Date of Patent: Apr. 21, 2020

(54) ELECTRONIC DEVICES WITH ADJUSTABLE DECORATION

(71) Applicant: Apple Inc., Cupertino, CA (US)

(72) Inventors: James R. Wilson, Cupertino, CA (US); Marta M. Giachino, Palo Alto, CA (US); Matthew S. Rogers, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/134,846

(22) Filed: Sep. 18, 2018

(65) Prior Publication Data

US 2019/0297177 A1    Sep. 26, 2019

Related U.S. Application Data

(60) Provisional application No. 62/646,677, filed on Mar. 22, 2018.

(51) Int. Cl.
| | |
|---|---|
| *H04M 1/02* | (2006.01) |
| *G02F 1/17* | (2019.01) |
| *G02F 1/1523* | (2019.01) |
| *G02F 1/137* | (2006.01) |
| *G02F 1/1334* | (2006.01) |
| *G02B 5/28* | (2006.01) |
| *H05K 5/02* | (2006.01) |
| *G06F 1/16* | (2006.01) |

(52) U.S. Cl.
CPC ............ *H04M 1/0283* (2013.01); *G02B 5/28* (2013.01); *G02F 1/1334* (2013.01); *G02F 1/13718* (2013.01); *G02F 1/13725* (2013.01); *G02F 1/1523* (2013.01); *G02F 1/172* (2013.01); *G06F 1/1633* (2013.01); *H05K 5/0243* (2013.01)

(58) Field of Classification Search
CPC .... H04M 1/0283; G02F 1/172; G02F 1/1334; G02F 1/13725; G02F 1/1523; G02F 1/13718; G02B 5/28; H05K 5/0243
USPC .......................................................... 455/566
See application file for complete search history.

(56) References Cited

U.S. PATENT DOCUMENTS

| | | | |
|---|---|---|---|
| 7,242,393 B2 | 7/2007 | Caldwell | |
| 7,248,239 B2 | 7/2007 | Dowling et al. | |
| (Continued) | | | |

FOREIGN PATENT DOCUMENTS

| | | |
|---|---|---|
| WO | 2018015922 A1 | 1/2018 |

*Primary Examiner* — Inder P Mehra
(74) *Attorney, Agent, or Firm* — Treyz Law Group, P.C.; G. Victor Treyz; David K. Cole (57) ABSTRACT

An electronic device may have a housing in which electrical components such as a display and other components are mounted. Adjustable decoration may be formed on the electronic device. The adjustable decoration may serve as trim for the housing or a component mounted on the housing, may include a logo, or may be used to form other visual elements. The adjustable decoration may have an appearance that is electrically adjustable by control circuitry in the electronic device. The control circuitry may measure sensor data using sensors, may gather user input from input-output devices, and may gather other information with input-output devices to detect events. When an event is detected such as an incoming communication, a calendar reminder, user input, activation of an electrical component such as a camera, or other event, the control circuitry can adjust the appearance of the adjustable decoration.

18 Claims, 8 Drawing Sheets

(56) References Cited

U.S. PATENT DOCUMENTS

| | | | |
|---|---|---|---|
| 7,373,180 B2 | 5/2008 | Swanson et al. | |
| 8,132,100 B2 | 3/2012 | Seo et al. | |
| 8,159,750 B2 | 4/2012 | Yokota et al. | |
| 8,223,426 B2 | 7/2012 | Dean et al. | |
| 8,384,674 B1 | 2/2013 | Slothower et al. | |
| 8,947,648 B2* | 2/2015 | Swanson | G01B 9/02004 356/28 |
| 9,363,869 B2 | 6/2016 | Zhang | |
| 9,468,114 B2 | 10/2016 | Chiang et al. | |
| 9,513,501 B2 | 12/2016 | Yu et al. | |
| 9,917,935 B2 | 3/2018 | Pizzo et al. | |
| 9,952,624 B2 | 4/2018 | Suurpaa et al. | |
| 9,991,654 B1 | 6/2018 | DePhillips | |
| 10,042,480 B2 | 8/2018 | Krahenbuhl et al. | |
| 2003/0017848 A1* | 1/2003 | Engstrom | G06F 1/1626 455/558 |
| 2005/0036605 A1* | 2/2005 | Mulligan | H04M 1/0202 379/433.01 |
| 2005/0170154 A1* | 8/2005 | Breukers | A63C 5/003 428/195.1 |
| 2012/0044045 A1 | 2/2012 | Zuo et al. | |
| 2013/0022800 A1 | 1/2013 | Hsieh | |
| 2014/0063784 A1 | 3/2014 | Muiter | |
| 2014/0085699 A1 | 3/2014 | Huang | |
| 2014/0132569 A1* | 5/2014 | Lien | G06F 3/041 345/175 |
| 2014/0368757 A1* | 12/2014 | Chen | H03K 17/9622 349/12 |
| 2017/0097555 A1* | 4/2017 | Lattes | E06B 9/24 |
| 2017/0106637 A1* | 4/2017 | Yamazaki | B32B 7/02 |
| 2017/0295910 A1* | 10/2017 | Lamberger | G02B 5/0808 |
| 2018/0032204 A1 | 2/2018 | Imazeki | |
| 2018/0217690 A1* | 8/2018 | Bauer | G06F 3/0383 |
| 2018/0275801 A1 | 9/2018 | Nakayama et al. | |
| 2018/0324288 A1 | 11/2018 | Rothbaum | |
| 2018/0356945 A1* | 12/2018 | Gannon | G06F 1/1626 |

\* cited by examiner

ELECTRONIC DEVICES WITH ADJUSTABLE DECORATION

This application claims the benefit of provisional patent application No. 62/646,677, filed Mar. 22, 2018, which is hereby incorporated by reference herein in its entirety.

FIELD

This relates generally to electronic devices, and more particularly, to electronic devices with decoration.

BACKGROUND

Electronic devices such as cellular telephones include electrical components such as displays, sensors, buttons, and other components. The electrical components in an electronic device allow the device to gather input from a user and the user's surroundings and allow the device to provide output to the user.

Electronic devices such as cellular telephones and other devices also include structures that are primarily decorative, such as ink layers and patterned metal features. These structures, which may sometimes be referred to as decoration, may be used to provide a device with an attractive appearance. In some arrangements, features such as patterned metal or ink layers may be used to form a logo.

SUMMARY

An electronic device may have a housing in which electrical components such as a display and other components are mounted. In some configurations, the housing may include a transparent member such as a glass layer. The electronic device may be a wearable device having a housing or other support structure that is configured to be worn by a user.

Adjustable decoration may be formed on the electronic device. The adjustable decoration may serve as trim for the housing or a component mounted on the housing, may be visible through the transparent member, or may otherwise be incorporated into the electronic device. The adjustable decoration may have an appearance that is electrically adjustable by control circuitry in the electronic device.

The control circuitry may measure sensor data using sensors, may gather user input from input-output devices, and may gather other information. When an appropriate event is detected such as an incoming communication, a calendar reminder, user input, activation of an electrical component such as a camera, or other event, the control circuitry can adjust the appearance of the adjustable decoration, thereby helping to notify the user and others of the occurrence of the event. The adjustable decoration can also be adjusted for aesthetic reasons.

DETAILED DESCRIPTION

An electronic device may include input-output devices such as displays, cameras, sensors, and other components. Decoration may be included in the electronic device such as trim structures around portions of an electronic device housing, trim surrounding a display or camera, or other trim structures, a decorative logo, coatings with desired appearances, or other decorative structures (sometimes referred to as decoration, decorative layers, patterned decorative structures, etc.). For example, a housing wall of a cellular telephone or other device may be provided with decoration. The decoration is not used to display complex content such as still and moving image content displayed on a display, but rather provides the electronic device with a desired appearance and/or brand marking.

To enhance the functionality of the electronic device, the decoration in the electronic device may be adjustable. For example, the surface of the electronic device may be provided with one or more layers with optical characteristics that are electrically adjustable. By adjusting the electrically adjustable layer(s), the appearance of decoration that is formed from the layers and/or that is overlapped by the layers can be adjusted.

With one illustrative configuration, an inner surface of a glass housing wall may be provided with one or more decorative elements with a fixed appearance (e.g., a patterned logo, a blanket coating of a desired appearance, etc.) and may be provided with one or more adjustable layers. An electrically adjustable layer such as a layer with adjustable tint, reflectivity, and/or haze, can overlap the fixed decorative elements. During operation of the electronic device, the appearance of the decoration can be adjusted. Adjustments can be made that serve as a visual notification (e.g., to alert a user or others in the vicinity of the electronic device of the occurrence of an event such as receipt of a message, activation of a camera, etc.). Adjustments can also be made based on user input. For example, a user may supply the electronic device with input specifying a desired color or other appearance attribute.

Illustrative electronic devices that may be provided with adjustable decoration are shown in FIGS. 1, 2, 3, and 4.

Figure 1:
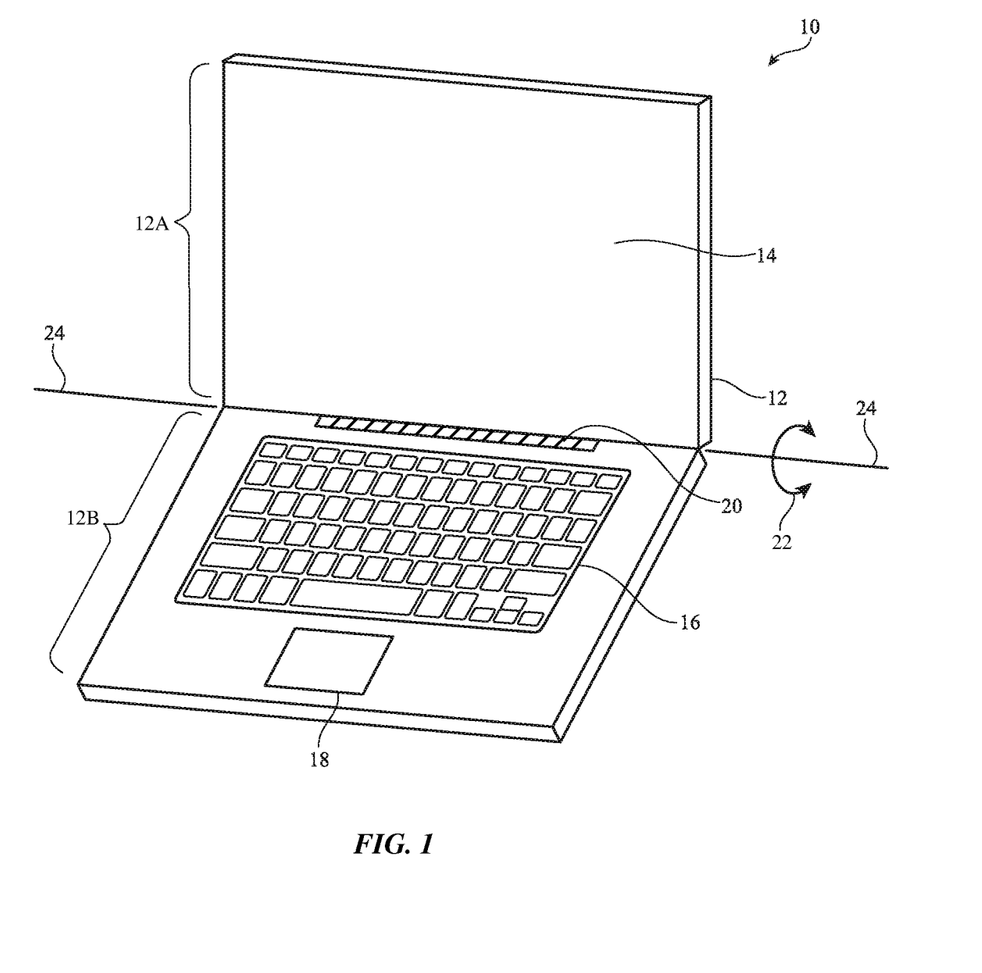
FIG. 1 is a perspective view of an illustrative electronic device such as a laptop computer in accordance with an embodiment.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
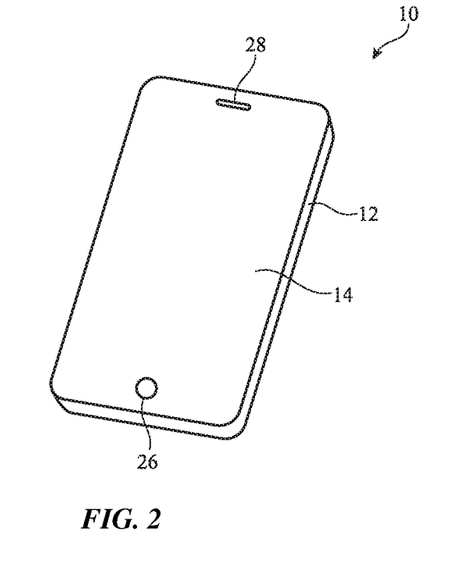
FIG. 2 is a perspective view of an illustrative electronic device such as a handheld electronic device in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26 or button functions can be implemented using touch sensors, force sensors, and/or other sensors under display 14. Openings may also be formed in display 14 to accommodate a speaker port (see, e.g., speaker port 28 of FIG. 2).

Figure 3:
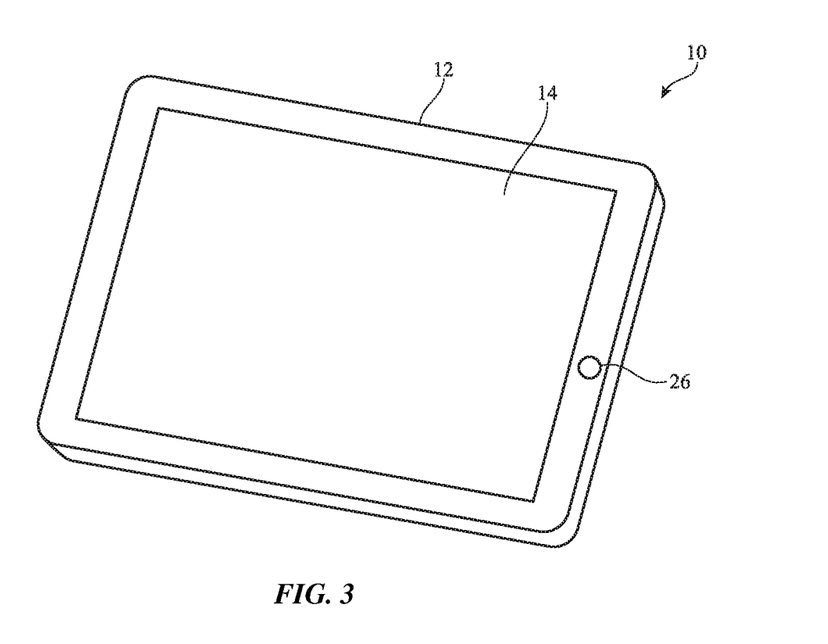
FIG. 3 is a perspective view of an illustrative electronic device such as a tablet computer, wristwatch, head-mounted device, or other wearable device in accordance with an embodiment.

Electronic device 10 may be a tablet computer, a wristwatch device, a wearable device (e.g., a head-mounted device), or other device. For example, device 10 of FIG. 3 may be a small portable device such as a wristwatch or other wearable device. A strap may be attached to device 10 to allow device 10 to be worn on the hand or head of a user. In some configurations, device 10 may be a head-mounted device (e.g., a helmet, goggles, glasses, etc.). As shown in FIG. 3, electronic device 10 may, in some configurations, have a housing (e.g., housing 12) with opposing planar front and rear surfaces (e.g., in configurations in which device 10 is a tablet computer). Display 14 may be mounted on the front surface of housing 12. In some configurations, display 14 may have an opening to accommodate a component such as button 26 (as an example). In head-mounted devices and other wearable devices, housing 12 may be configured to be worn by a user on the user's head (e.g., housing 12 may be configured to form a head-mounted support structure or other support structure enabling device 10 to be worn by a user).

Figure 4:
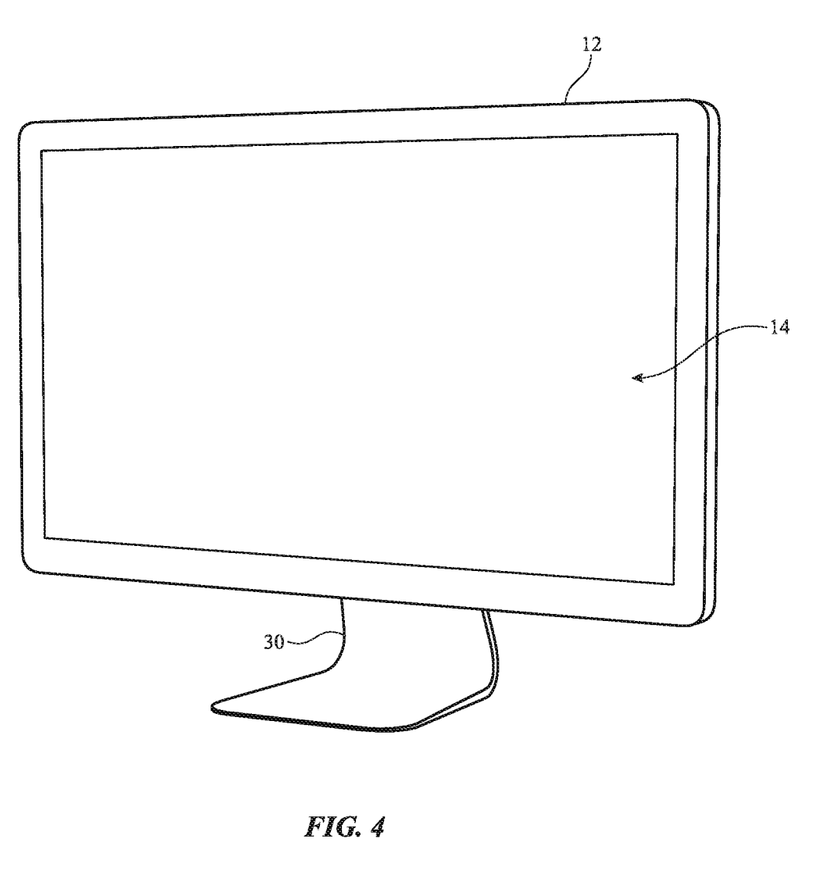
FIG. 4 is a perspective view of an illustrative electronic device such as a computer in accordance with an embodiment.

FIG. 4 shows how electronic device 10 may be a computer display or a computer that has been integrated into a computer display. With this type of arrangement, housing 12 for device 10 may be mounted on a support structure such as stand 30 or stand 30 may be omitted (e.g., to mount device 10 on a wall). Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wristwatch device, a pendant device, a headphone or earpiece device, or other wearable or miniature device (e.g., glasses, goggles, other head-mounted equipment, etc.), a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components, light-emitting diodes (e.g., organic light-emitting diodes or light-emitting diodes formed from individual crystalline semiconductor dies), electrophoretic display components, or other suitable image pixel structures.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
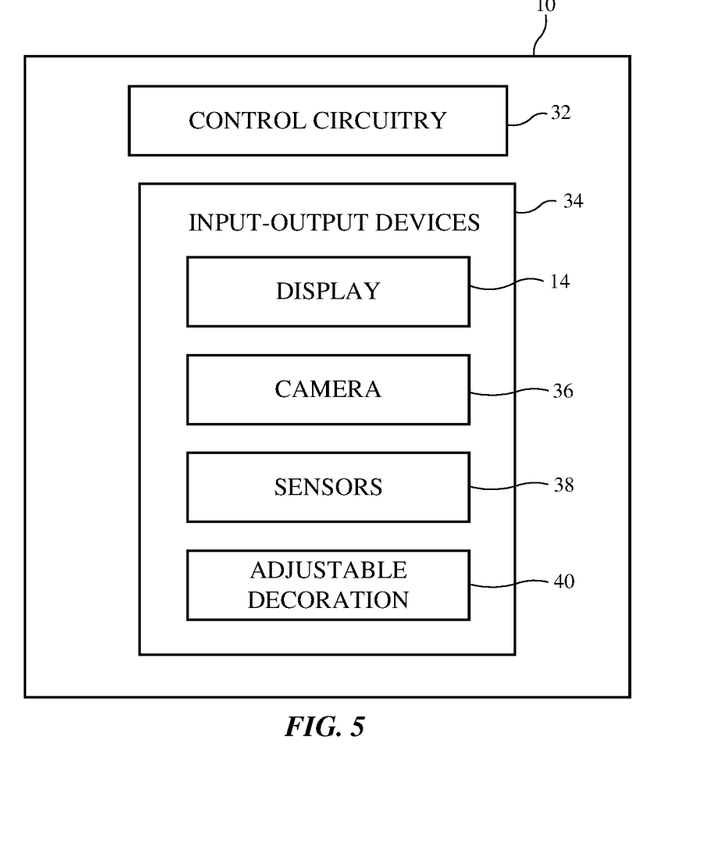
FIG. 5 is a schematic diagram of an illustrative electronic device in accordance with an embodiment.

A schematic diagram of device 10 showing illustrative components that may be used in device 10 is shown in FIG. 5. As shown in FIG. 5, electronic device 10 may have control circuitry 32. Control circuitry 32 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 32 may be used to control the operation of device 10. The processing circuitry may be based on one or more microprocessors, microcontrollers, digital signal processors, baseband processors, power management units, audio chips, application specific integrated circuits, etc. Control circuitry 32 may include radio-frequency transceiver circuitry, antennas, and/or other communications circuitry for forming communications links between device 10 and external equipment (e.g., wired links, wireless links such as cellular telephone lines, wireless local area network links, Bluetooth® links, etc.). Satellite navigation system receiver circuitry in control circuitry 32 may be used to gather information on the geographic location of device 10. Location information can also be gathered using information on wireless local area network connections, cellular telephone information (e.g., information on the identify of cell towers communicating with device 10), etc.

Input-output circuitry in device 10 such as input-output devices 34 may be used to allow data to be supplied to device 10 and to allow data to be provided from device 10 to external devices. Input-output devices 34 may include buttons, joysticks, scrolling wheels, touch pads, key pads, keyboards, microphones, speakers, tone generators, haptic output devices (e.g., vibrators), cameras, light-emitting diodes and other status indicators, data ports, etc. A user can control the operation of device 10 by supplying commands through input-output devices 34 and may receive status information and other output from device 10 using the output resources of input-output devices 34.

Input-output devices 34 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 34 may also include sensors 38. Sensors 38 may include a capacitive sensor, a light-based proximity sensor, a magnetic sensor, an accelerometer, a force sensor, a touch sensor, a temperature sensor, a pressure sensor, a compass, a microphone, a color ambient light sensor, depth sensors, and other sensors. Image sensors such as camera 36 may be used to capture images. For example, cameras such as camera 36 may be mounted on a front face of a tablet computer, cellular telephone, or watch, may be mounted above display 14 in a laptop or desktop computer, or may otherwise be mounted in housing 12. If desired, cameras such as camera 36 may be mounted on a rear housing wall (e.g., on the rear face of a cellular telephone, tablet, etc.). In head-mounted devices, cameras such as camera 36 may be mounted in outwardly facing locations on a housing (e.g., to capture real-world images of a user's surroundings including people in the vicinity of the user).

Adjustable decoration 40 may include one or more adjustable components such as one or more electrically adjustable layers that are each configured to modify one or more optical characteristics of decoration 40. These optical characteristics may include, for example, tint (e.g., opacity and/or color), reflectivity, transmission, absorption, and haze. In some arrangements, adjustable decoration 40 may include fixed decorative elements (e.g., patterned layer(s) of metal or other materials that form trim, logos, text, and/or other patterns). Configurations in which adjustable layer(s) and layer(s) of fixed appearance are combined to form adjustable decoration 40 may also be used.

In some arrangements, adjustable decoration 40 is formed on a front face of device 10 (e.g., on the side of device 10 containing display 14). In other arrangements, adjustable decoration 40 is formed on other device locations. For example, adjustable decoration 40 may be formed on curved or planar sidewalls in device 10 (e.g., housing walls that extend between a rear housing wall and the front of device 10). Adjustable decoration 40 may also be formed on some or all of a rear housing wall in device 10. Device 10 may, as an example, have a rear housing wall that is formed from a glass layer or other transparent member. Adjustable decoration 40 may be formed on the inner (interior) surface of the glass layer so as to be visible from the exterior of device 10. Arrangements may also be used in which adjustable decoration is mounted under a display cover layer on a front face of device 10 (e.g., in a peripheral portion of the display cover layer adjacent to display 14). Illustrative scenarios in which adjustable decoration 40 is formed under a transparent member such as a rear housing glass layer may sometimes be described herein as an example. Other arrangements for incorporating adjustable decoration 40 into device 10 may be used, if desired.

Figure 6:
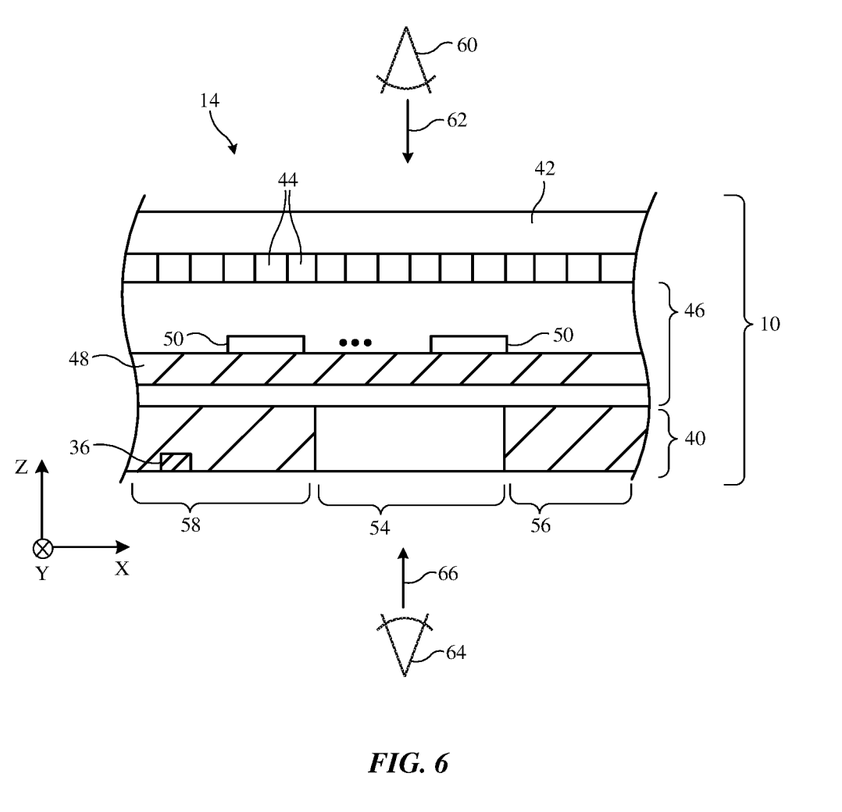
FIG. 6 is a cross-sectional side view of an illustrative electronic device in accordance with an embodiment.

A cross-sectional side view of a portion of electronic device 10 is shown in FIG. 6. In the illustrative configuration of FIG. 6, device 10 has a front side (front face) on which display 14 is formed. A user such as viewer 60 who is viewing device 10 in direction 62 may view images displayed on pixels 44 of display 14. Pixels 44 may be arranged in an array under display cover layer 42 (e.g., a layer of clear glass or polymer). Device 10 also has an opposing rear side (rear face) on which adjustable decoration 40 is formed. Electrical components 50 (see, e.g., control circuitry 32 and/or input-output devices 34 of FIG. 1) may be mounted on one or more substrates such as printed circuit 48 in interior 46 of device 10.

Decoration 40 may have an adjustable appearance to a user such as viewer 64 who is viewing the rear of device 10 in direction 66. In the example of FIG. 6, a rear-facing camera such as camera 36 has been mounted in the housing of device 10. In some configurations, adjustable decoration 40 and camera 36 may both be visible to viewer 64. For example, camera 36 and decoration 40 may both face outwardly from device interior 46 (e.g., in a rearward direction in the illustrative configuration of FIG. 6).

In some configurations, adjustable decoration 40 has a uniform appearance. In other configurations, different portions of adjustable decoration 40 have different respective appearances. As shown in FIG. 6, one or more layers of material that make up adjustable decoration 40 may be patterned to from respective portions such as first portion 58, second portion 54, and third portion 56, which can each have the same visual appearance and/or which can each have a different respective visual appearance to a user.

In some configurations, adjustable decoration 40 has a three-dimensional shape (e.g., the shape of a ridge or other protrusion, the shape of a groove or other recess, a pyramidal shape, a conical shape, a shape with a box-shaped protrusion or recess, and/or other three-dimensional shape). Illustrative arrangements in which adjustable decoration 40 has the form of a thin layer (e.g., a coating, etc.) are sometimes described herein as an example.

Figure 7:
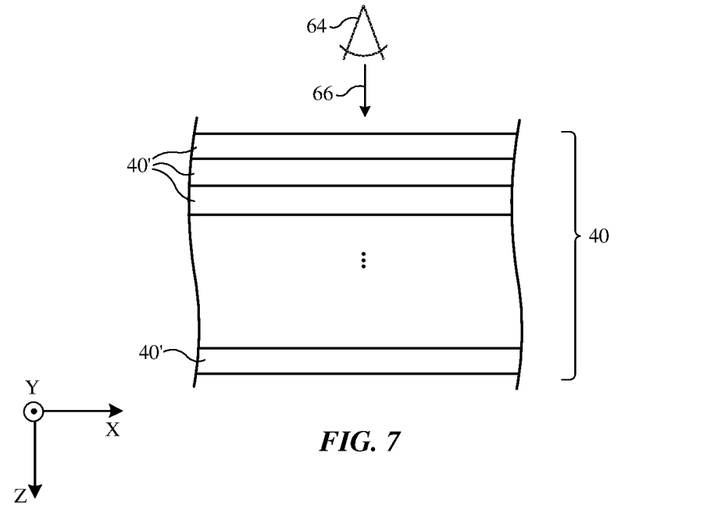
FIG. 7 is a cross-sectional side view of layers for adjustable decoration in an electronic device in accordance with an embodiment.

As shown in FIG. 7, adjustable decoration 40 may have one or more layers 40' (sometimes referred to as sublayers). Layers 40' may include fixed layers such as fixed patterned metal layers, fixed patterned thin-film interference filters formed from dielectric stacks, fixed patterned polymer layers (e.g., polymer with diffusing embedded particles, a polymer coating and/or other polymer with or without colorant such as dye and/or pigment, laminated polymer films, etc.), fixed layers of fabric, textured films, frosted glass, etc. Layers 40' may also include one or more adjustable optical layers. The adjustable layer(s) may be used in adjusting optical characteristics for adjustable decoration 40 and may include components such as an adjustable tint layer, an adjustable mirror layer, an adjustable haze layer, etc.

An adjustable tint layer (sometimes referred to as a light modulator layer or adjustable color layer) may be formed form a light modulator component such as an electrochromic device, guest-host liquid crystal device, a suspended particle device, or other suitable electrically adjustable tint layer. Light absorption and/or color (in transmission and/or in reflection) can be adjusted using the adjustable tint layer.

An electrochromic device may have a pair of transparent electrodes. An electrolyte such as LiNiOP (e.g., a gel electrolyte) may be interposed between electrochromic coatings on the electrodes. The electrochromic coatings may be, for example, a $Li_xNiO$ coating on a first of the electrodes and a $WO_3$ coating on a second of the electrodes. The electrodes may be used to apply a current to the electrochromic coatings to either darken (color) or lighten (discolor) electrochromic layer. Electrochromic devices may exhibit low haze (e.g., less than 5%) and may maintain their current state in the event of a failure. If desired, a tint layer for adjustable decoration 40 may be implemented using a solid state electrochromic device in which solid organic or inorganic material is used to form the electrochromic electrolyte.

A guest-host liquid crystal device may include a light-absorbing dye "guest" in a liquid crystal "host" layer. These materials may form a layer that is sandwiched between a pair of transparent electrodes. When an electric field is applied to the guest-host layer, the liquid crystals rotate, thereby rotating the guest dye into an orientation that enhances light absorption. When the electric field is removed, the guest dye molecules are no longer held in the high-absorption orientation so that layer becomes transparent. The guest-host layer may vary between transparent and opaque. Partially transparent states may also be exhibited (e.g., at intermediate electric field values). In some states (e.g., non-transparent states), the guest-host layer may exhibit a color cast (e.g., a color associated with the guest dye).

Layers 40' may also include an adjustable tint layer implemented using a suspended particle device. A suspended particle device contains a layer of nanoparticles suspended in a liquid that is sandwiched between substrate layers with transparent conductive electrodes. In the absence of an applied electric field, the nanoparticles are randomly oriented and absorb light (i.e., the tint of the adjustable tint layer is dark). When the electric field is applied, the nanoparticles align and allow light to pass (i.e., the tint of the layer is clear). In addition to allowing an adjustable tint to be obtained, suspended particle devices are characterized by an associated adjustable haze (e.g., a 6% haze when the suspended particle device is off and is exhibiting a low amount of light absorption and a 50% haze when the suspended particle device is on and is exhibiting a high amount of light absorption). In this way, a suspended particle device may serve both as an adjustable tint layer and as an adjustable haze layer.

In some arrangements, layers 40' may include an adjustable reflectivity layer. An adjustable reflectivity layer for adjustable decoration 40 may be formed from an adjustable reflectivity component such as a cholesteric liquid crystal layer. A cholesteric liquid crystal device may exhibit a mirror reflectivity that is adjustable. When used in adjustable decoration 40, the cholesteric liquid crystal device may be characterized by an "on" state and an "off" state. In the "on" state (e.g., when control circuitry 32 applies a voltage to the cholesteric liquid crystal device), the cholesteric liquid crystal device may be transparent. The transmission of the cholesteric liquid crystal device may be adjusted by adjusting the applied voltage (i.e., a cholesteric liquid crystal layer may serve both as an adjustable reflectivity layer and as an adjustable tint layer). In the "off" state, the cholesteric liquid crystal device may act as a partial mirror and may reflect more than 50% of incident light, more than 70% of incident light, less than 99% of incident light, or other suitable amount of incident light.

Cholesteric liquid crystal layers may exhibit relatively fast switching speeds, low haze (e.g., haze values of less than 5%), and good reflectivity (e.g., when "off"). If desired, adjustable reflectivity layers may be implemented using other types of adjustable mirror components. For example, an adjustable reflectivity component for adjustable decoration 40 may be formed from a solid-state switching mirror component based on a switchable metal hydride film (e.g., adjustable decoration 40 may include an adjustable magnesium hydride mirror layer).

If desired, haze may be adjusted using an adjustable haze layer in layers 40'. An adjustable haze layer may be implemented using a polymer-dispersed liquid crystal device. In this type of device, a polymer layer having voids filled with liquid crystal material may be sandwiched between conductive transparent electrodes on respective first and second transparent substrates. When no electric field is applied to the electrodes, the liquid crystals in the voids are randomly oriented and exhibit an index-of-refraction difference with the surrounding polymer layer. This causes the liquid crystal material of the voids to produce a relatively large amount of haze that scatters light that is passing through the polymer layer. When electric field is applied to the electrodes by control circuitry 32, the liquid crystals of the liquid crystal material in the voids becomes aligned so that the liquid crystal material in the voids exhibits an index of refraction that matches the surrounding polymer. In this configuration, the adjustable haze layer exhibits low haze and high transparency. Intermediate haze levels may be achieved by applying an electric field at an intermediate level.

In addition to incorporating one or more of these adjustable optical layers in layers 40' of adjustable decoration 40, one or more fixed optical layers 40' may be incorporated in adjustable decoration 40. Layers 40' may, for example, be implemented using fixed reflectivity layers (e.g., thin reflective metal coatings, thin reflective dielectric stack coatings, etc.), fixed tint (e.g., glass or polymer that has been darkened by incorporation of light-absorbing particles, dye, metal coating material, etc.), and/or fixed haze (e.g., by incorporating a textured polymer or glass layer, a hazy layer formed from microbubbles or light-scattering particles in a glass or plastic material, etc.). In general, any type of adjustable layer that exhibits an adjustable appearance can be incorporated into decoration 40. The use of adjustable layers in providing adjustable decoration with adjustable optical characteristics (e.g., adjustable appearance characteristics) using layer(s) with adjustable tint, haze, and/or reflectivity is illustrative.

Figure 8:
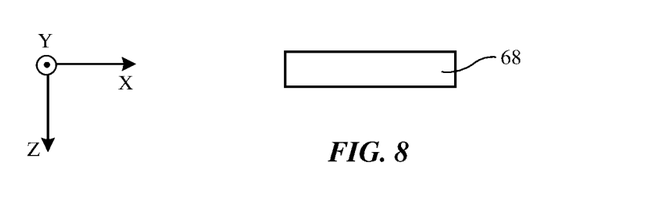
FIG. 8 is a cross-sectional side view of a layer of decoration in accordance with an embodiment.

An example of structure that may be used as a fixed decoration layer is shown in FIG. 8. Layer 68 of FIG. 8 may be a solid layer of metal, polymer (e.g., polymer with pigment, dye, and/or other colorant and/or clear polymer), ceramic, glass, textured material or other hazy material (e.g., a polymer layer with embedded inorganic particles of differing refractive index, embedded gas bubbles, and/or other light-scattering particles), and/or other solid layer.

Figure 9:
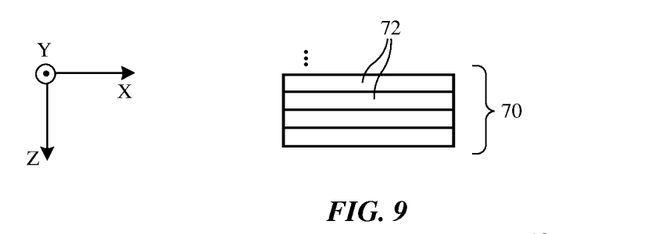
FIG. 9 is a cross-sectional side view of a dielectric stack forming a thin-film interference filter structure for a decoration layer in accordance with an embodiment.

As another example, consider the dielectric stack of layer 70 of FIG. 9. Layer 70 may be formed from multiple dielectric layers 72. Layers 72 may be, for example, thin-film layers each having a thickness of less than 3 microns, less than 1.5 microns, less than 0.5 microns, or other small thickness. The refractive index values of layers 72 may alternate or have other suitable arrangements. The thicknesses, materials, and refractive indices of layers 72 may be selected to form a thin-film interference filter from layer 70 with desired optical attributes (desired reflectivity, light absorption, and light transmission as a function of wavelength). Using this type of thin-film interference filter structure, layer 70 can be provided with a desired appearance.

Layers such as layer 68 and/or layer 70 may be deposited as blanket films (e.g., globally throughout adjustable decoration 40) and/or may be patterned (e.g., localized so that these layers appear only in selected areas within adjustable decoration 40). Patterns of layers may form logos, decorative symbols, text, trim, and/or other decoration. In forming adjustable decoration 40, one or more patterned layers and/or blanket layers such as layers 68 and/or layer 70 may be used in combination with one or more adjustable optical layers.

Figure 10:
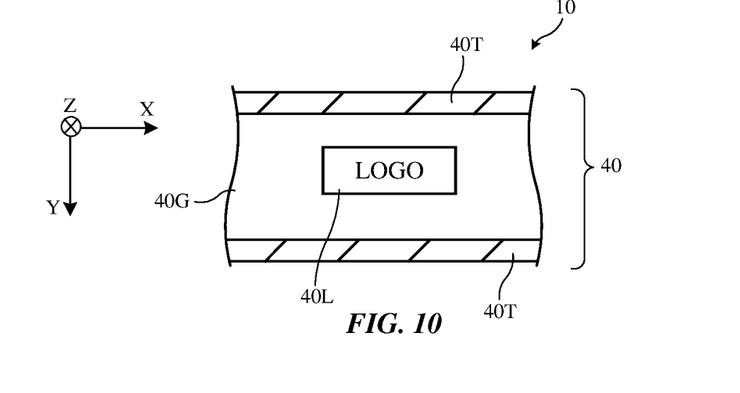
FIG. 10 is a rear view of an illustrative electronic device with decoration in accordance with an embodiment.

A top view of illustrative adjustable decoration for device 10 is shown in FIG. 10. In the example of FIG. 10, portion

40G of adjustable decoration 40 has a first appearance (e.g., a first reflectivity, color, and/or haze), trim portions 40T have a second appearance (e.g., a second reflectivity, color, and/or haze), and logo 40L has a third appearance (e.g., a third reflectivity, color, and/or haze). The relative appearances of each of these portions of adjustable decoration 40 can be individually varied with respect to each other and/or global appearance adjustments can be made to two or three of these portions using adjustable layer(s) that overlap (above and/or below) the fixed appearance layers.

Figure 11:
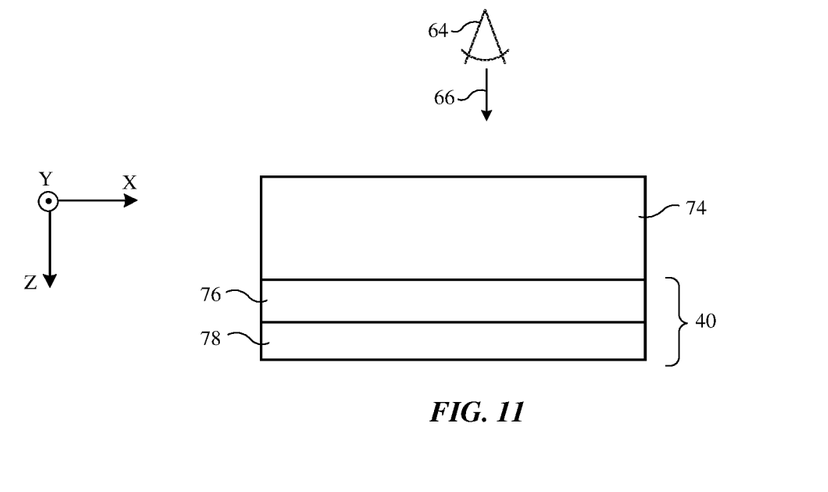
FIGS. 11 and 12 are cross-sectional side views of illustrative layers for an electronic device with decoration in accordance with an embodiment.
Figure 12:
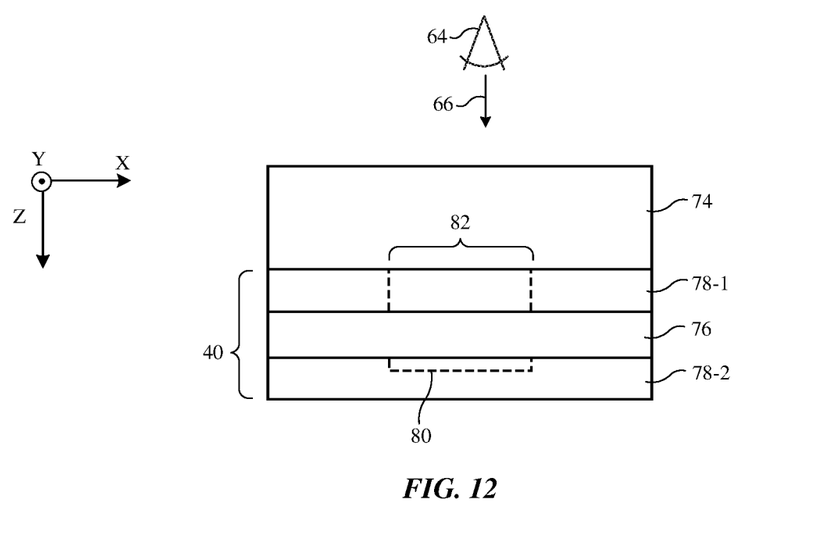

Illustrative configurations for adjustable decoration 40 in device 10 are shown in FIGS. 11 and 12. In the examples of FIGS. 11 and 12, viewer (user) 64 is viewing device 10 in direction 66 through layer 74. Layer 74 may be, for example, a clear rear housing wall, a transparent housing wall on another portion of device 10, or other transparent structure in device 10 (e.g., a clear layer of polymer, glass, ceramic, a clear crystalline material such as sapphire, etc.). If desired, adjustable decoration 40 of FIGS. 11 and 12 may be formed in other portions of device 10. The configurations of FIG. 11 and FIG. 12 are presented as examples.

In the illustrative arrangement of FIG. 11, adjustable decoration 40 includes an adjustable layer such as adjustable layer 76 interposed between decoration layer 78 and the interior surface of transparent layer 74. Layers such as layers 76 and 78 may be laminated onto the inner surface of layer 74 using heat and/or pressure and/or may be attached with intervening layers of adhesive.

Layer 78 may be a layer of fixed decoration. For example, layer 78 may have one or more layers of patterned structures such as patterned portions of layer 68 of FIG. 8 and/or patterned portions of layer 70 of FIG. 9 in a pattern that forms a logo, trim, text, and/or other decorative elements. As an example, a metal logo or a thin-film interference filter mirror in the shape of a logo may be formed in layer 78. The interior portion of layer 78 (e.g., the portion facing the interior of device 10) may be formed from a polymer layer (e.g., an ink or paint containing colorant in a polymer) that overlaps the logo and serves as a solid background. The logo may, as an example, have a shinny reflective appearance and the polymer layer may have a dark appearance that allows the polymer layer to serve as a global background layer behind the shiny logo (e.g., the logo may be interposed between layer 76 and the dark polymer layer of layer 78). In other configurations, patterned metal, patterned polymer (e.g., polymer with colorant), textured layers of metal, polymer, glass, or other material, and/or thin-film interference filters forming reflective mirrors, colored reflective layers (e.g., layers tinted blue or red by virtue of a non-uniform visible light reflection spectrum), and/or other structures in layer 78 may be used to form non-adjustable decoration patterns in layer 78.

Layer 76 of FIG. 11 is interposed between layer 78 and layer 74 and therefore adjusts the appearance of layer 78 to viewer 64 as viewer 64 is viewing device 10 in direction 66. Layer 76 may be any suitable adjustable optical layer (e.g., an adjustable tint layer, adjustable mirror layer, adjustable haze layer, and/or a layer that adjusts other optical attributes and/or combinations of any two or more of these attributes). As an example, consider a scenario in which adjustable layer 76 is an adjustable tint layer that exhibits an electrical adjustable opacity ranging from black to clear. When placed in its clear state, layer 76 allows viewer 64 to view the pattern formed by layer 78 (e.g., a shiny logo). When placed in its non-transparent state(s), layer 76 partially or completely obscures layer 78 from view (e.g., the logo may be partially or completely blocked). The color of a logo or other pattern can also be adjusted in this way. As another example, consider a scenario in which layer 76 is an adjustable haze layer. In its low haze state, layer 76 may be sufficiently clear to allow viewer 64 to view layer 78. In a higher haze state, layer 76 may be sufficiently hazy to partly or completely obscure layer 78. In a scenario in which layer 76 is an adjustable mirror, layer 76 can be placed in a low reflectivity state or a high reflectivity state, thereby altering how much (if any) of layer 78 is visible and how much ambient light is reflected to viewer 64.

If desired, adjustable layer 76 may be interposed between fixed decoration layers 78-1 and 78-2, as shown in FIG. 12. Layers 78-1 and 78-2 may be, for example, layers with metal, polymer (e.g., colored polymer), dielectric stacks forming thin-film interference filter structures (mirrors, colored filters, antireflection coatings, etc.), and/or textured layers (e.g., layers with fixed haze). As with layer 78 of FIG. 11, different regions of layers 78-1 and/or 78-2 may be patterned differently to form logos, text, trim, and/or other patterns of decoration. As shown in FIG. 12, for example, layer 78-1 may have an optional opening in region 82 with a desired pattern. If, as an example, layer 78-2 is a white background layer and layer 78-1 is a black foreground layer, opening 82 may have the shape of a logo, so that viewer 64 views a white logo on a black background. Layer 78-2 may also include patterned regions such as region 80. For example, layer 78-1 may be a partially transparent red layer and layer 78-2 may be a black layer with a metal logo shape in region 80. In this scenario, a reflective red logo will appear in region 80 surrounded by a reddish dark background.

When it is desired to adjust the appearance of adjustable decoration 40 of FIG. 12, control circuitry 32 may electrically adjust the optical characteristics of layer 76, which is interposed between layer 78-1 and 78-2. As an example, consider a scenario in which layer 78-1 has a color gradient (e.g., a laterally varying color cast) and in which layer 78-2 has a black polymer backing layer with a foreground metal logo (e.g., a metal logo formed between the black polymer layer and layer 76. In a first illustrative embodiment, layer 76 is an adjustable tint layer that varies between an opaque white color (in which case the logo is blocked and the rear of device 10 has a color gradient determined by the appearance of layer 78-1 and a transparent state (in which case the logo is visible and has a color gradient determined by the appearance of layer 78-1). In a second illustrative embodiment, layer 76 is an adjustable haze layer. In its low haze state, layer 76 may be sufficiently clear to allow viewer 64 to view layer 78-2. When viewing layer 78-2, layer 78-2 is viewed through layer 74 (e.g., a transparent housing layer) and through layer 78-1 (which may impart a tint, gradient, haze pattern, and/or other characteristics to the appearance of layer 78-2). In its higher haze state, layer 76 may be sufficiently hazy to partly or completely obscure layer 78-2 while allowing the hazy surface of layer 76 to be viewed through layer 78-1. In a third illustrative embodiment, layer 76 is a layer with an adjustable mirror reflectivity. When layer 76 is an adjustable mirror, layer 76 can be placed in a low reflectivity state or a high reflectivity state, thereby altering how much (if any) of layer 78-2 is visible through layer 78-1 and layer 76 and adjusting the appearance of decoration 40.

Adjustable decoration 40 can be adjusted slowly (e.g., with smooth variations over time periods of 1-10 s, at least 2 s, less than 100 s, or other suitable adjustment time periods) and/or may be adjusted rapidly (e.g., flashing on and/off or otherwise abruptly changing appearance over a time period of 0.1-0.3 s, at least 0.01 s, less than 0.2 s, or other suitable time period). The appearance of decoration 40 may be changed intermittently (e.g., once per day or week as a user desires to alter the appearance of device 10) and/or can be adjusted more frequently, continuously, in response to satisfaction of suitable adjustment criteria, etc. For example, control circuitry 32 can monitor for incoming cellular telephone calls, text messages, email messages, or other communications and can adjust the appearance of adjustable decoration 40 in response (e.g., a logo, the background of a logo, and/or a global layer covering a logo can be changed in appearance and/or can flash repeatedly between first and second appearance states to indicate that an incoming telephone call or message has been received). As another example, control circuitry 32 can adjust the appearance of adjustable decoration 40 in response to detection of an event such as a reminder associated with a calendar entry, expiration of a timer, or other time-based and/or date-based appearance adjustment criteria. For example, when a calendar reminder occurs or when a timer expires, adjustable decoration 40 can flash, change color, change haze, change opacity, and/or otherwise be adjusted in appearance.

Figure 13:
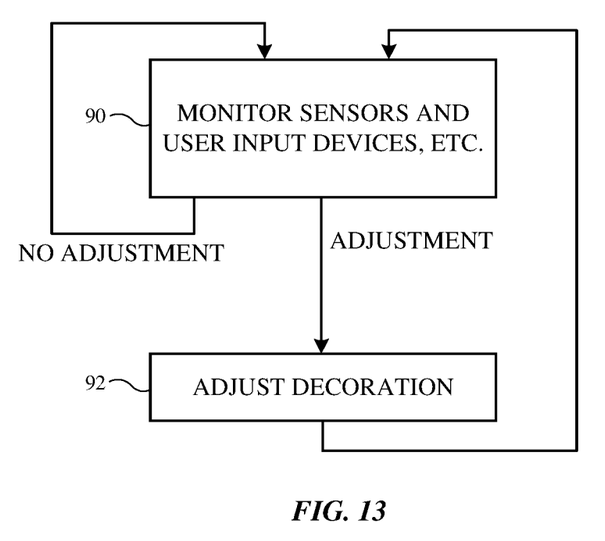
FIG. 13 is a flow chart of illustrative operations involved in operating an electronic device with adjustable decoration in accordance with an embodiment.

A flow chart of illustrative operations involved in using a device such as device 10 with adjustable decoration 40 is shown in FIG. 13. During the operations of block 90, control circuitry 32 may use input-output devices 34 to monitor for the occurrence of user input from the user of device 10, for the occurrence of particular sensor readings (e.g., measurements of light, temperature, magnetism, sound, etc.), to monitor for the occurrence of a particular geographic location (e.g., a location determined by satellite navigation system receiver circuitry in control circuitry 32), to monitor for the occurrence of other events (particular times and/or dates, etc.), to monitor for the receipt of a telephone call, message, or other communications, to monitor for the proximity of a peer device or accessory (as indicated, for example, by the formation of a wireless link that pairs device 10 to external equipment), to monitor for the presence of particular users, to monitor for the activation of particular functions within device 10 (e.g., to monitor for activation of a camera application that allows camera 36 to capture still and/or moving images), to monitor for the activation of operation system features (e.g., voice recognition, facial scanning, etc.), and/or to monitor for the occurrence of other events.

Events that may warrant adjustment of decoration 40 can include events measured using sensors 38 and/or other circuitry in device 10 (e.g., input-output devices 34), user input, communications, events measured by detecting the operating state of components in device 10 and/or the operating state of a camera application, voice recognition application, sound recording application, or other application and/or operating system software component, and/or other events. If no events warranting adjustment of adjustable decoration 40 are detected, processing can continue during the operations of block 90 (e.g., the circuitry of device 10 can continue to monitor for event occurrence). In response to detection of an event warranting adjustment of adjustable decoration 40, device 10 (e.g., control circuitry 32) may adjust the appearance of adjustable decoration 40 during the operations of block 92.

As an example, in response to detection that camera 36 (e.g., a camera facing people in the vicinity of the user) is active, the appearance of adjustable decoration 40 can be adjusted to alert these people that the camera is active (e.g., that the camera is capturing image data including images of the people). As another example, if an incoming call or message is detected or if a calendar reminder is triggered or a timer expires, the appearance of adjustable decoration 40 can be adjusted (e.g., by flashing, changing once or twice, etc.) to alert the user of the presence of incoming communications or other event. The appearance of decoration 40 can also be adjusted by a user for aesthetic reasons (e.g., to coordinate the appearance of decoration 40 with a user's clothing, the appearance of a removable case on device 10, the housing of device 10, etc.). In some configurations, power consumption can be reduced by using adjustable decoration 40 to provide a user with alerts and other information in place of more power intensive adjustable components in device 10 (e.g., in place of display 14). For example, the color of the rear of device 10 can be changed relatively infrequently and/or can remain changed persistently (e.g., until cleared by a user) to remind a user that a message has been received. This appearance adjustment process may consume significantly less power than if device 10 were to power display 14 continuously to display the same type of reminder (as an example). Providing a user with notifications and other information via changes to the appearance of decoration 40 may also be less obtrusive than other forms of notification. A backlight can be provided behind some or all of decoration 40 and used in adjusting the appearance of decoration 40 and/or backlight components can be omitted (e.g., to help conserve power).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a housing having a transparent layer;
adjustable decoration that is overlapped by the transparent layer and has an appearance when viewed through the transparent layer, wherein the adjustable decoration includes a first decoration layer having a fixed pattern and includes a second decoration layer with an adjustable optical component; and
control circuitry configured to adjust the appearance in response to an event.

2. The electronic device defined in claim 1 wherein the adjustable optical component comprises an adjustable tint layer.

3. The electronic device defined in claim 1 wherein the adjustable optical component comprises an adjustable haze layer.

4. The electronic device defined in claim 1 wherein the adjustable optical component comprises an adjustable mirror layer.

5. An electronic device, comprising:
a housing having a transparent layer;
adjustable decoration that is overlapped by the transparent layer and has an appearance when viewed through the transparent layer, wherein the adjustable decoration includes a first decoration layer having a fixed pattern and includes a second decoration layer with an adjustable optical component and wherein the adjustable optical component is an electrically adjustable layer with a variable optical characteristic and wherein the adjustable optical component is interposed between the first decoration layer and the transparent layer; and
control circuitry configured to adjust the appearance in response to an event.

6. The electronic device defined in claim 5 wherein the event comprises detection of user input and wherein the control circuitry is configured to adjust the appearance of the adjustable decoration by adjusting the electrically adjustable layer in response to the user input.

7. The electronic device defined in claim 5 further comprising a sensor that is configured to measure sensor data associated with occurrence of the event, wherein the control circuitry is configured to adjust the appearance of the adjustable decoration in response to the sensor data.

8. The electronic device defined in claim 5 wherein the event is associated with receipt of a message with the control circuitry and wherein the control circuitry is configured to adjust the appearance of the adjustable decoration in response to the receipt of the message.

9. The electronic device defined in claim 5 wherein the control circuitry comprises communications circuitry configured to receive cellular telephone calls, wherein the event comprises receipt of an incoming cellular telephone call, and wherein the control circuitry is configured to adjust the appearance to create a flashing notification for a user in response to the receipt of the incoming cellular telephone call.

10. The electronic device defined in claim 1 wherein the fixed pattern of the first decoration layer is configured to form a logo.

11. The electronic device defined in claim 1 wherein the adjustable decoration comprises a third decoration layer, wherein the third decoration layer is interposed between the second decoration layer and the transparent layer, and wherein the second decoration layer is interposed between the first decoration layer and the transparent layer.

12. The electronic device defined in claim 11 wherein the third decoration layer includes a dielectric stack configured to form a thin-film interference filter.

13. The electronic device defined in claim 11 wherein the first decoration layer is configured to form a logo.

14. The electronic device defined in claim 11 wherein the adjustable optical component comprises an adjustable opacity layer.

15. The electronic device defined in claim 11 wherein the adjustable optical component is configured to exhibit adjustable haze.

16. An electronic device, comprising:
a housing having a transparent layer;
adjustable decoration that is overlapped by the transparent layer, wherein the adjustable decoration is adjustable between a first appearance and a second appearance when viewed through the transparent layer; and
control circuitry configured to adjust the adjustable decoration repeatedly between the first appearance and the second appearance in response to an event.

17. The electronic device defined in claim 16 wherein the adjustable decoration comprises an adjustable optical component selected from the group of components consisting of: an adjustable tint layer, an adjustable haze layer, and an adjustable mirror layer.

18. The electronic device defined in claim 17 wherein the control circuitry is configured to flash the adjustable decoration repeatedly between the first appearance and the second appearance in response to receiving a text message.

* * * * *